(12) United States Patent
Kappertz et al.

(10) Patent No.: US 11,711,092 B2
(45) Date of Patent: Jul. 25, 2023

(54) METHOD FOR DETERMINING AN INVERSE IMPULSE RESPONSE OF A COMMUNICATION CHANNEL

(71) Applicant: Endress+Hauser Flowtec AG, Reinach (CH)

(72) Inventors: Jannis Kappertz, Aesch (CH); Alexander Stutz, Kienberg SO (CH); Markus Wucher, Lörrach (DE)

(73) Assignee: Endress+Hauser Flowtec AG, Reinach (CH)

( * ) Notice: Subject to any disclaimer, the term of this patent is extended or adjusted under 35 U.S.C. 154(b) by 0 days.

(21) Appl. No.: 17/756,124

(22) PCT Filed: Nov. 9, 2020

(86) PCT No.: PCT/EP2020/081443
§ 371 (c)(1),
(2) Date: May 18, 2022

(87) PCT Pub. No.: WO2021/099154
PCT Pub. Date: May 27, 2021

(65) Prior Publication Data
US 2022/0407536 A1 Dec. 22, 2022

(30) Foreign Application Priority Data
Nov. 19, 2019 (DE) ............ 10 2019 131 217.5

(51) Int. Cl.
*H03M 1/12* (2006.01)
*H03K 7/04* (2006.01)
*H04L 25/03* (2006.01)

(52) U.S. Cl.
CPC ............ *H03M 1/1255* (2013.01); *H03K 7/04* (2013.01); *H04L 25/03006* (2013.01)

(58) Field of Classification Search
CPC .... H03M 1/1255; H03M 1/742; H03M 1/508; H03K 7/04; H04L 25/03006
(Continued)

(56) References Cited

U.S. PATENT DOCUMENTS 9,584,345 B1 * 2/2017 Baecher ............. H04L 27/2275
2009/0219983 A1 * 9/2009 Gerfers ............... H04L 25/0305
375/232

(Continued)

FOREIGN PATENT DOCUMENTS

EP 0936783 A2 8/1999

OTHER PUBLICATIONS

Suthendran, et al., Performance Comparison of Adaptive and Blind Equalization Algorithms for Wireless Communication, Bonfring International Journal of Reserach in Communication Engineering, vol. 3, No. 1, Mar. 2013, 6 pp.

*Primary Examiner* — Dac V Ha
(74) *Attorney, Agent, or Firm* — Mark A. Logan; Endress+Hauser (USA) Holding, Inc.

(57) ABSTRACT

A method for determining an inverse impulse response of a communication channel by means of a PAM receiver comprises the following method steps: switching on the PAM receiver; if a second PAM transceiver is switched on, setting a difference between a clock frequency of the data signal and a sampling frequency of the first PAM transceiver; comparing a symbol that is output by the interpreter with a state that is supplied to the interpreter, and outputting an error value, wherein in each case a symbol associated with a sampling clock is compared with a state associated with the same sampling clock; adapting m filter coefficients of the equalizer to minimize error values; repeating the third method step and the fourth method step until an error limit value is reached.

5 Claims, 3 Drawing Sheets

(58) Field of Classification Search
CPC ...... H04L 2025/03363; H04L 25/0307; H04B 3/46; H04B 14/023
See application file for complete search history.

(56) References Cited

U.S. PATENT DOCUMENTS

| | | |
|---|---|---|
| 2012/0183025 A1 | 7/2012 | Manickam et al. |
| 2020/0007363 A1* | 1/2020 | Hossain .............. H04L 25/4917 |
| 2022/0400034 A1* | 12/2022 | Kappertz ............ H04L 25/4917 |

* cited by examiner

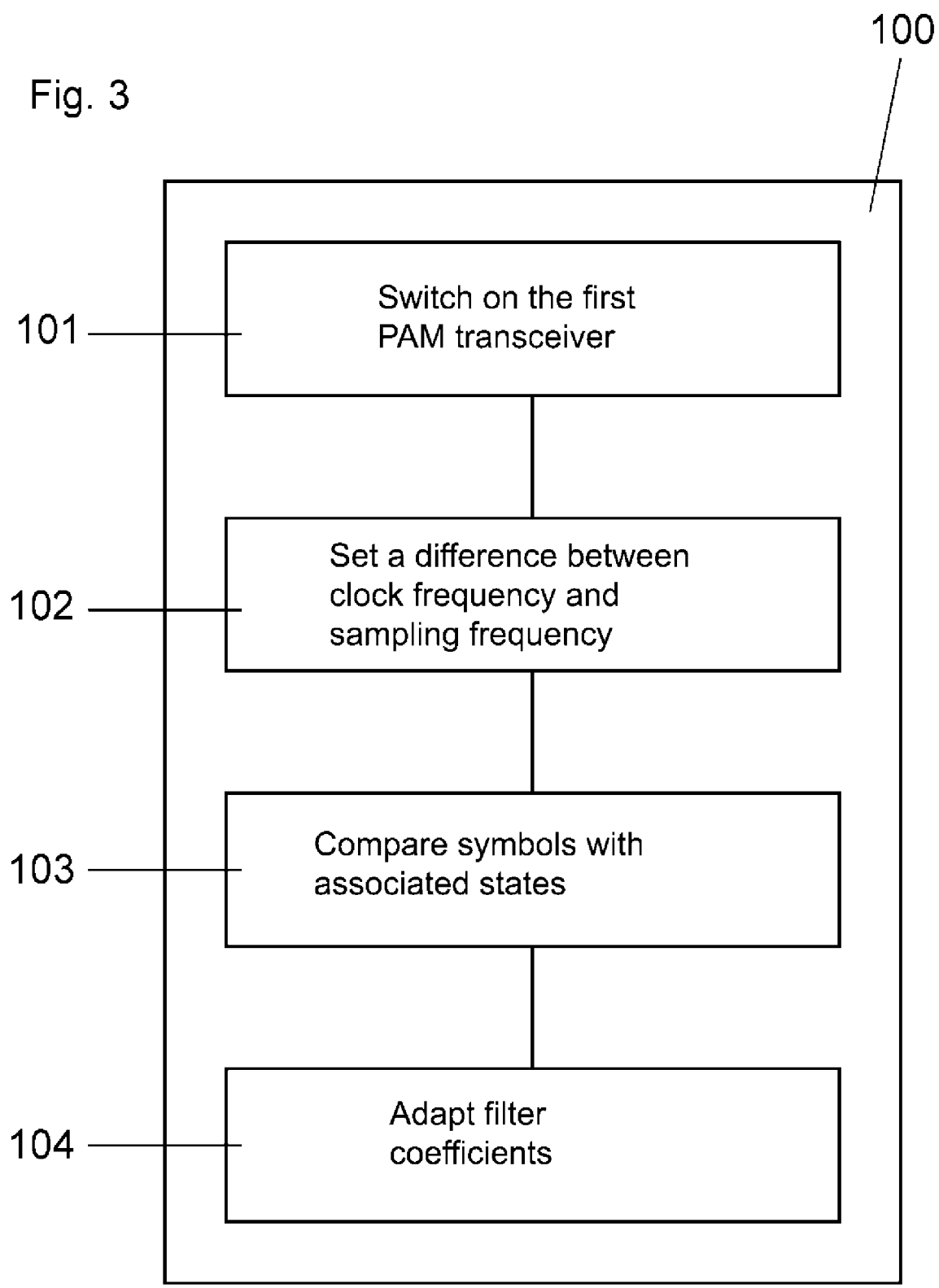

METHOD FOR DETERMINING AN INVERSE IMPULSE RESPONSE OF A COMMUNICATION CHANNEL

CROSS-REFERENCE TO RELATED APPLICATIONS

The present application is related to and claims the priority benefit of German Patent Application No. 10 2019 131 217.5, filed on Nov. 19, 2019 and International Patent Application No. PCT/EP2020/081443 filed on Nov. 9, 2020, the entire contents of which are incorporated herein by reference.

TECHNICAL FIELD

The invention relates to a method for determining an inverse impulse response of a communication channel with a pulse amplitude modulation receiver, or also, for short, a PAM receiver, connected to the communication channel.

BACKGROUND

Pulse amplitude modulation is a known method for transmitting information, wherein a transmitter encodes information on an electrical signal by means of PAM, for example, wherein said signal is received and decoded by a receiver.

PAM signals have several states in the form of various signal levels and can also have more than two states. For example, in "DSL Simulation Techniques and Standard Development for Digital Subscriber Line," published in "Macmillan Technical Publishing," 1998, D. Walter and Y. Chen describe a PAM transceiver for generating and processing PAM signals.

Communication channels generally have a negative effect on incoming electrical signals; with increasing length of a communication channel, voltage levels or states of a PAM signal decay or mix. A received electrical signal must therefore be processed at a receiver, depending upon the extent of signal distortion.

To process a distorted signal, knowledge of an inverse to an impulse response of the communication channel is necessary. Usually, two PAM transceivers connected via the communication channel are synchronized in their frequencies and phases. However, this may possibly be complicated.

SUMMARY

It is therefore an aim of the invention to determine a robust method for determining an inverse of an impulse response of a communication channel, which communication channel connects a PAM receiver that is asynchronous in relation to a PAM transmitter.

In a method according to the invention for determining an inverse impulse response of a communication channel with a PAM receiver, connected to the communication channel, comprising an adaptive filter, wherein the communication channel, for the purpose of communication with a PAM transmitter by means of an electrical data signal D, is configured with at least two states Z, and in particular at least three states, wherein the states in each case represent a symbol, wherein a symbol S of the data signal is assigned to each clock of the data signal, wherein the PAM receiver has an electronic circuit 10, which comprises the following:

A data interface 11 configured to connect to the communication channel, in particular to a duplex communication channel;

A circuit section connected to the data interface, comprising:

An equalizer 12 for compensating for disturbances of the digital signal caused by the communication channel, wherein the equalizer has a first input for receiving the data signal D, and wherein the equalizer has an output for outputting a processed data signal;

An interpreter, arranged downstream of the equalizer, for detecting symbols transmitted by the digital signal, wherein the interpreter receives the processed data signal;

comprises the following method steps:

Switching on the PAM receiver in a first method step;

If a PAM transmitter is switched on, setting a difference U between a clock frequency of the data signal and a sampling frequency of the PAM receiver in a second method step;

Comparing a symbol S output by the interpreter with a state Z that is supplied to the interpreter, and outputting an error value E in a third method step, wherein in each case a symbol associated with a sampling clock is compared with a state associated with the same sampling clock;

Adapting m filter coefficients FK of the equalizer in order to minimize error values in a fourth method step with m as natural number;

Repeating the third method step and the fourth method step until an error limit value FG is reached.

In one embodiment, the PAM receiver can also transmit data signals and thus be a PAM transceiver. In one embodiment, the PAM transmitter can also receive data signals and thus be a PAM transceiver.

In one embodiment, if filter coefficients converge to 0, the difference U is selected to be larger, and the third method step and the fourth method step are repeated until convergence to filter coefficients occurs.

An adequate convergence can be determined, for example, by evaluating differences in the calculated filter coefficients of successive iterations. For example, falling below a maximum difference value may be a criterion for adequate convergence.

A plausibility of the filter coefficients can be checked, for example, by comparison with an estimation of expected filter coefficients. In the case when a cable length is known approximately and/or the cable technology is known, an expected value for filter coefficients can be indicated by physical-technical estimation.

In one embodiment, the following condition is satisfied:

$$U/AK > G$$

where AK is an adaptation coefficient for determining an iterative adaptation rate of the filter coefficients, and G is a limit value.

In one embodiment, filter coefficients FK, with each subsequent clock n+1, are calculated as follows:

$$FK(n+1) = FK(n) + AK \cdot E(n) \cdot DK(n),$$

where AK is the adaptation coefficient,
where FK is a list with m entries,
and where DK is a list of the last m states of the data signal D.

In one embodiment, the comparison is carried out by a subtraction circuit with two inputs and one output, wherein the output of the subtraction circuit is supplied to an input of the equalizer for the purpose of adapting the filter coefficients to an input of the equalizer, and wherein a state output by the equalizer and a symbol output by the interpreter are supplied to the subtraction circuit, or wherein the equalizer has a subtraction circuit, wherein the symbol output by the interpreter is supplied to the subtraction circuit via a second input of the equalizer.

In one embodiment, the adaptation of filter coefficients is based upon a minimization of error squares or upon a "least mean square" method.

BRIEF DESCRIPTION OF THE DRAWINGS

The invention will now be described with reference to exemplary embodiments.

FIG. 3 describes the exemplary sequence of a method according to the present disclosure.

DETAILED DESCRIPTION

Figure 1:
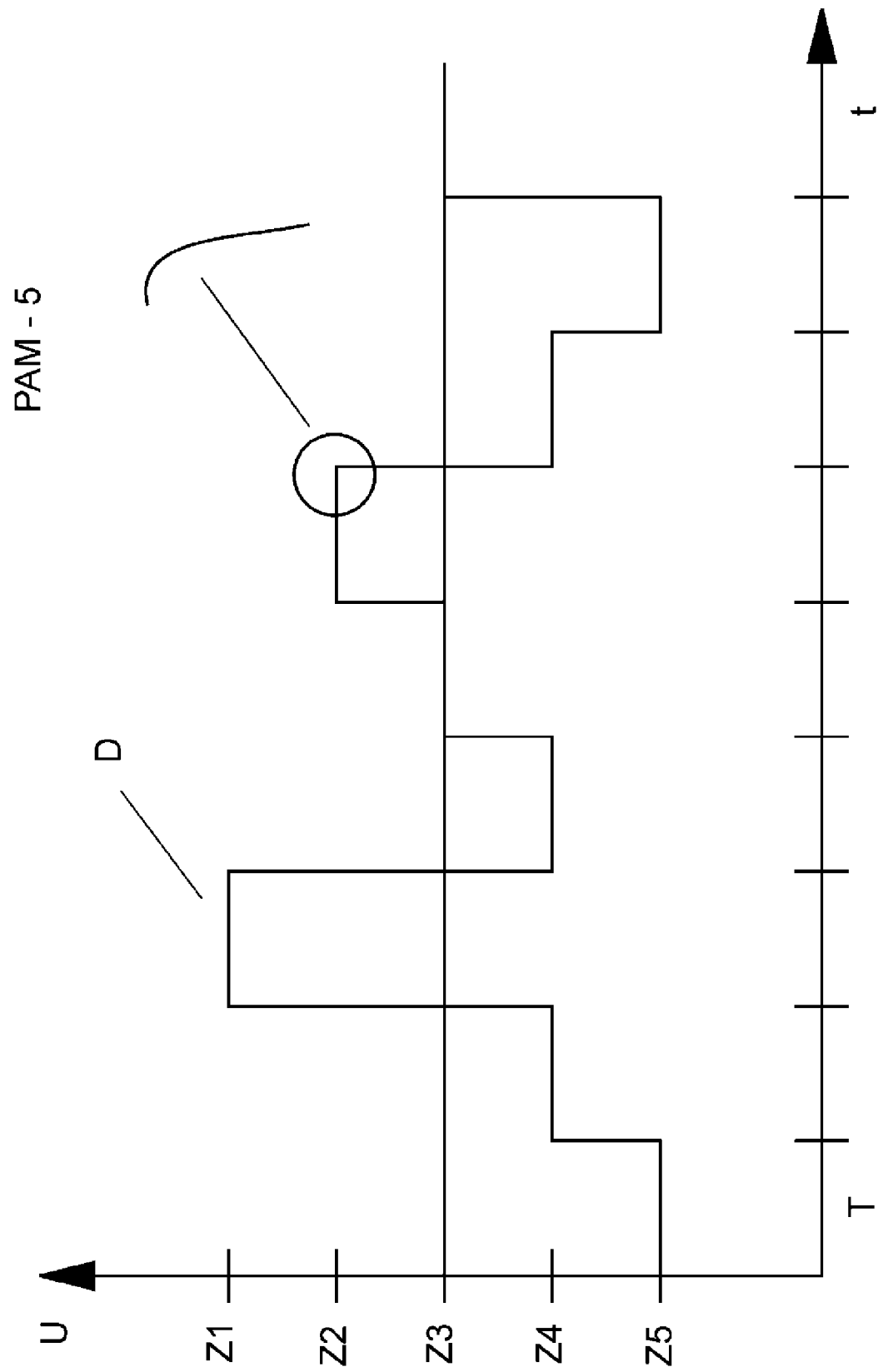
FIG. 1 describes an exemplary PAM signal.

FIG. 1 illustrates an exemplary amplitude-modulated data signal D, a PAM-5 signal with 5 states Z1 through Z5. Each state has a duration which corresponds to a clock T of the data signal D. By setting up more than two states, the information density of the data signal is increased. However, due to interference, the data signal suffers state decay, which is expressed in an initial stage as indicated by a rounding of the signal edges. In the advanced stage, state decay leads to adjacent states running into each other and mixing. With knowledge of the channel impulse response of the channel, the decay can be compensated for at least partially, or the data signal can be extensively processed. PAM signals are not limited to 5 states, however, but can generally be two or more states or signal levels.

Figure 2:
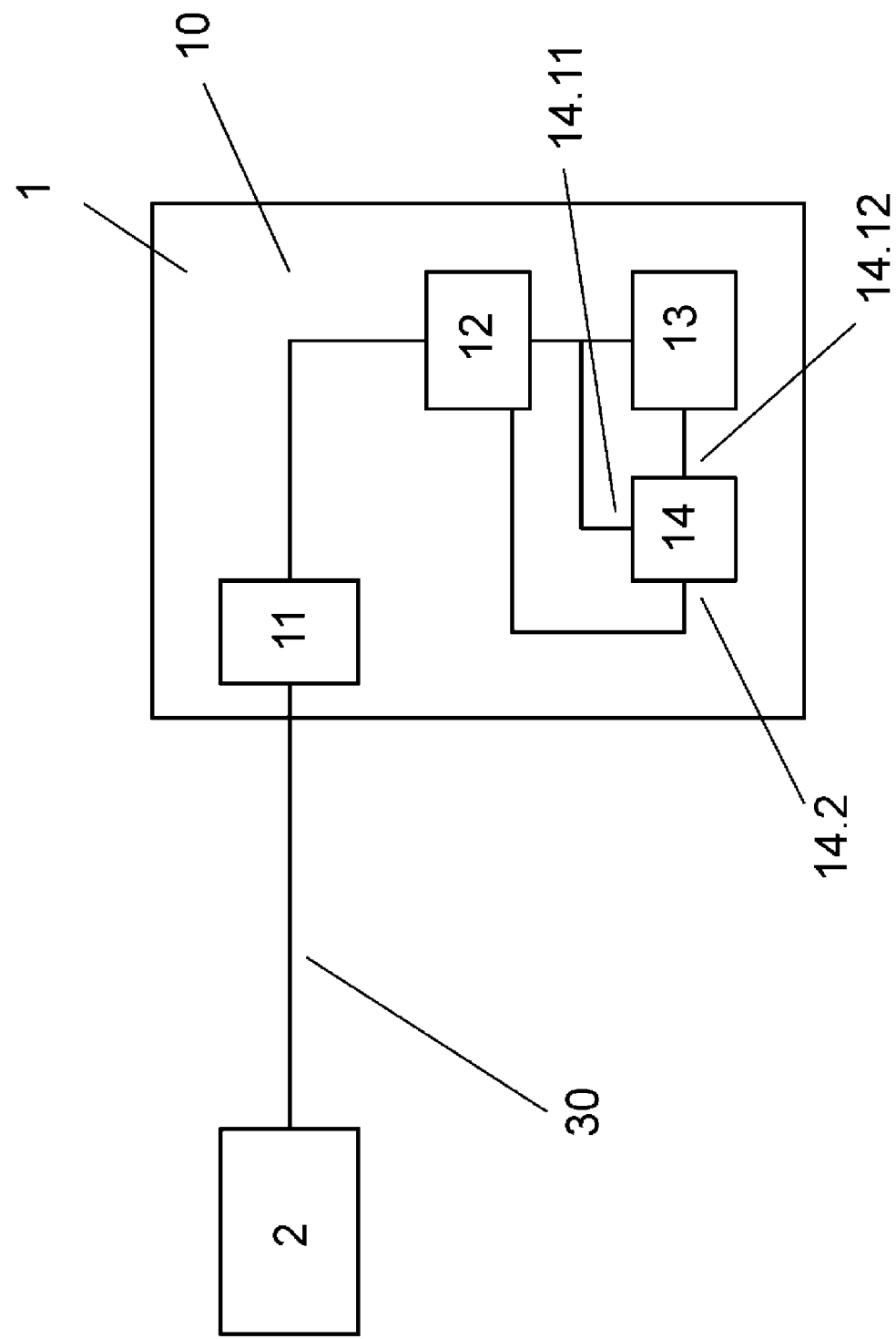
FIG. 2 shows a cutout of a PAM receiver.

FIG. 2 shows a PAM receiver 1 and a PAM transmitter 2, which are connected via a communication channel 30. The PAM receiver, by means of which, according to the invention, an inverse of the impulse response of the communication channel is determined, has an electronic circuit 10 with a data interface 11, connected to the communication channel, an equalizer 12, an interpreter 13, and also a subtraction circuit 14 with two inputs 14.11 and 14.12 as well as an output 14.2. The electronic circuit 10 has further electronic components, not shown here, which are not relevant to the invention. PAM signals, as illustrated by way of example in FIG. 1, have several states which correspond to various signal levels. When passing through a communication channel, these states undergo distortions, which are caused, for example, by interference capacitances and/or interference inductances of the communication channel. Such distortions or state decays can, however, be recalculated at least partially, provided these disturbing influences are known. The knowledge of these disturbing influences is expressed in the knowledge of the inverse of the impulse response. The data interface 11 acquires the incoming PAM signal or data signal and digitizes it by means of an analog/digital converter (not shown), wherein the digitized PAM signal is supplied to the equalizer 12. The data signal, which is at least partially equalized by the equalizer, is forwarded to an interpreter 13, which assigns symbols to the states of the data signal. The assignment of the symbols is based upon digital values of voltages or signal levels of the incoming states. Here, the equalizer has an adaptive filter, which filter sets its own filter coefficients such that symbols output by the interpreter match states transmitted to the interpreter. The adaptive filter can, for example, mix the data signal, with a time delay, with itself. In this case, filter coefficients relate, for example, to a number of mixtures, mixing strength, and time-shifting of the mixtures.

Here, a subtraction circuit 14 compares symbols, output by the interpreter, with states transmitted to the interpreter and forwards a result of the comparison to the equalizer. This result is used by the equalizer to adapt filter coefficients in order to improve a "state-symbol" assignment. If, for example, in the case of PAM-2, the "state-symbol" assignment at the beginning of adjustment of the filter coefficients functions correctly in considerably more than half of all the received states, there will be a convergence of the filter coefficients to the respective limit values. The convergence can, for example, be defined as complete if the result output by the subtraction circuit lies below an error limit value FG. Falling below the error limit value can be a fall below the error limit value by a mean value of the differences of several clocks. The comparison is based upon an evaluation of a difference between a digital value of a state and a digital value of a symbol.

After convergence of the filter coefficients, knowledge of the inverse is stored in the filter coefficients. In the prior art, this process takes place with the PAM receiver 1 synchronized with the PAM transmitter 2. In this context, synchronous means that a sampling frequency of the data signal by the PAM receiver corresponds to a clock frequency of the data signal D, and sampling points correlate with signal levels, and not with signal edges. A slight asynchrony effect must be avoided at all costs, since in that case sampling points in the data signal will be slightly shifted with each clock and thus inevitably correlate with clock edges, and in particular with zero crossings of a voltage of the data signal. In this case, the filter coefficients will converge to limit values which do not correspond to the inverse of the channel impulse response. Such limit values can in each case be a zero, for example.

The core of the invention is establishing a minimum asynchrony, with which it is ensured that sampling points fall only a few times successively into a region of a clock edge or of a zero crossing of a voltage. In this way, an averaging takes place between sampling points which correlate with signal levels and sampling points which correlate with signal edges or zero crossings. It has been shown that, in this case, filter coefficients converge to limit values which correspond to the inverse of the impulse response of the communication channel.

The minimum asynchrony can be set up, for example, by trial and error. If filter coefficients converge to 0 or to another limit value that does not correspond to the inverse, a difference UF between a sampling frequency and the clock frequency of the data signal is selected to be successively larger, until a convergence to meaningful or plausible limit values occurs.

It is also possible for a minimum asynchrony to be specified by the following equation: $UF/AK > G$, where AK is an adaptation coefficient for determining an iterative adaptation rate of the filter coefficients, and G is a limit value.

Filter coefficients FK, with each subsequent clock n+1, are calculated, for example, as follows:

$$FK(n+1) = FK(n) + AK*E(n)*DK(n),$$

where FK is a list with m entries, and where DK is, for example, a list of the last m states of the data signal D.

In one embodiment, the PAM receiver 1 can also transmit data signals and thus be a PAM transceiver.

In one embodiment, the PAM transmitter 2 can also receive data signals and can thus be a PAM transceiver.

FIG. 3 illustrates the sequence of a method 100 according to the invention, wherein the PAM receiver is switched on in a first method step 101. In a second method step 102, a minimum difference U between the clock frequency of the data signal D and the sampling frequency is ensured. In a third method step 103, symbols output by the interpreter are compared by the subtraction circuit 14 to states transmitted to the interpreter, and a difference is forwarded to the equalizer. In a fourth method step 104, filter coefficients of the equalizer are adapted in order to minimize the difference. The minimization of the differences can here be based upon a minimization of error squares.

In one embodiment, the PAM receiver 1 can also transmit data signals and thus be a PAM transceiver. In one embodiment, the PAM transmitter 2 can also receive data signals and can thus be a PAM transceiver.

The invention claimed is:

1. A method for determining an inverse impulse response of a communication channel with a pulse amplitude modulation (PAM) receiver connected to the communication channel, comprising an adaptive filter, wherein the communication channel, for the purpose of communication with a PAM transmitter by means of an electrical data signal, is configured with at least two states,
 wherein the states each represent a symbol, wherein a symbol is assigned to each clock of the data signal,
 wherein the PAM receiver has an electronic circuit including the following:
  a data interface configured to connect to the communication channel;
  a circuit section connected to the data interface, including:
   an equalizer for compensating for disturbances of the digital signal caused by the communication channel, wherein the equalizer has a first input for receiving the data signal and an output for outputting a processed data signal;
   an interpreter arranged downstream of the equalizer, for detecting symbols transmitted by the digital signal, wherein the interpreter receives the processed data signal;
 the method comprising:
  switching on the PAM receiver in a first method step;
  if a PAM transmitter is switched on, setting a difference, UF, between a clock frequency of the data signal and a sampling frequency of the PAM receiver in a second method step;
  comparing a symbol output by the interpreter with a state that is supplied to the interpreter, and outputting an error value, E, in a third method step, wherein a symbol associated with a sampling clock is compared with a state associated with the same sampling clock;
  adapting m filter coefficients of the equalizer to minimize error values in a fourth method step with m as natural number;
  repeating the third method step and the fourth method step until an error limit value is reached.

2. The method according to claim 1,
wherein, if filter coefficients converge to 0, UF is selected to be larger, and the third method step and the fourth method step are repeated until a convergence to filter coefficients occurs.

3. The method according to claim 1,
wherein filter coefficients with each subsequent clock n+1 are calculated as follows:

$$FK(n+1)=FK(n)+AK*E(n)*DK(n),$$

where AK is the adaptation coefficient, where FK is a list with m entries, and where DK is a list of the last m states of the data signal D.

4. The method according to claim 1,
wherein the comparing is carried out by a subtraction circuit with two inputs and one output, wherein the output of the subtraction circuit is supplied to an input of the equalizer for the purpose of adapting the filter coefficients to an input of the equalizer, and wherein a state output by the equalizer and a symbol output by the interpreter are supplied to the subtraction circuit, or
wherein the equalizer has a subtraction circuit, wherein the symbol output by the interpreter is supplied to the subtraction circuit via a second input of the equalizer.

5. The method according to claim 1,
wherein the adaptation of the filter coefficients is based upon a minimization of error squares.

* * * * *